United States Patent
Streefkerk et al.

(10) Patent No.: US 9,477,160 B2
(45) Date of Patent: *Oct. 25, 2016

(54) LITHOGRAPHIC APPARATUS AND DEVICE MANUFACTURING METHOD

(71) Applicant: ASML NETHERLANDS B.V., Veldhoven (NL)

(72) Inventors: Bob Streefkerk, Tilburg (NL); Johannes Jacobus Matheus Baselmans, Oirschot (NL); Henrikus Herman Marie Cox, Eindhoven (NL); Antonius Theodorus Anna Maria Derksen, Eindhoven (NL); Sjoerd Nicolaas Lambertus Donders, 's-Hertogenbosch (NL); Christiaan Alexander Hoogendam, Veldhoven (NL); Joeri Lof, Eindhoven (NL); Erik Roelof Loopstra, Heeze (NL); Jeroen Johannes Sophia Maria Mertens, Duizel (NL); Frits Van Der Meulen, Breda (NL); Johannes Catharinus Hubertus Mulkens, Valkenswaard (NL); Gerardus Petrus Matthijs Van Nunen, Berghem (NL); Klaus Simon, Eindhoven (NL); Bernardus Antonius Slaghekke, Veldhoven (NL); Alexander Straaijer, Eindhoven (NL); Jan-Gerard Cornelis Van Der Toorn, Eindhoven (NL); Martijn Houkes, Sittard (NL)

(73) Assignee: ASML NETHERLAND B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/624,167

(22) Filed: Feb. 17, 2015

(65) Prior Publication Data
US 2015/0168850 A1    Jun. 18, 2015

Related U.S. Application Data

(63) Continuation of application No. 13/188,026, filed on Jul. 21, 2011, now Pat. No. 8,964,164, which is a
(Continued)

(30) Foreign Application Priority Data

May 13, 2003 (EP) .................................... 03252955
Oct. 22, 2003 (EP) .................................... 03256643

(51) Int. Cl.
G03B 27/52    (2006.01)
G03B 27/42    (2006.01)
G03F 7/20     (2006.01)

(52) U.S. Cl.
CPC .......... *G03F 7/70341* (2013.01); *G03F 7/709* (2013.01)

(58) Field of Classification Search
CPC ............................ G03F 7/70341; G03F 7/709
USPC ........................ 355/30, 53; 250/548
See application file for complete search history.

(56) References Cited

U.S. PATENT DOCUMENTS

| 3,573,975 A | 4/1971 | Dhaka et al. | 117/212 |
| 3,648,587 A | 3/1972 | Stevens | 95/44 |

(Continued)

FOREIGN PATENT DOCUMENTS

| DE | 206 607 | 2/1984 |
| DE | 221 563 | 4/1985 |

(Continued)

OTHER PUBLICATIONS

M. Switkes et al., "Immersion Lithography at 157 nm", MIT Lincoln Lab, Orlando 2001-1, Dec. 17, 2001.
(Continued)

*Primary Examiner* — Hung Henry Nguyen
(74) *Attorney, Agent, or Firm* — Pillsbury Winthrop Shaw Pittman LLP

(57) ABSTRACT

In a lithographic apparatus, a localized area of the substrate surface under a projection system is immersed in liquid. The height of a liquid supply system above the surface of the substrate can be varied using actuators. A control system uses feedforward or feedback control with input of the surface height of the substrate to maintain the liquid supply system at a predetermined height above the surface of the substrate.

20 Claims, 6 Drawing Sheets

Related U.S. Application Data continuation of application No. 13/082,038, filed on Apr. 7, 2011, now Pat. No. 8,724,083, which is a continuation of application No. 12/068,546, filed on Feb. 7, 2008, now Pat. No. 7,936,444, which is a continuation of application No. 10/844,575, filed on May 13, 2004, now Pat. No. 7,352,434.

(56) References Cited

U.S. PATENT DOCUMENTS

| | | | |
|---|---|---|---|
| 4,346,164 A | 8/1982 | Tabarelli et al. | 430/311 |
| 4,390,273 A | 6/1983 | Loebach et al. | 355/125 |
| 4,396,705 A | 8/1983 | Akeyama et al. | 430/326 |
| 4,480,910 A | 11/1984 | Takanashi et al. | 355/30 |
| 4,509,852 A | 4/1985 | Tabarelli et al. | 355/30 |
| 5,040,020 A | 8/1991 | Rauschenbach et al. | 355/53 |
| 5,121,256 A | 6/1992 | Corle et al. | 359/664 |
| 5,528,100 A | 6/1996 | Igeta et al. | |
| 5,610,683 A | 3/1997 | Takahashi | 355/53 |
| 5,668,672 A | 9/1997 | Oomura | |
| 5,689,377 A | 11/1997 | Takahashi | |
| 5,715,039 A | 2/1998 | Fukuda et al. | 355/53 |
| 5,825,043 A | 10/1998 | Suwa | 250/548 |
| 5,835,275 A | 11/1998 | Takahashi | |
| 5,874,820 A | 2/1999 | Lee | |
| 5,900,354 A | 5/1999 | Batchelder | 430/395 |
| 6,191,429 B1 | 2/2001 | Suwa | 250/548 |
| 6,236,634 B1 | 5/2001 | Lee et al. | |
| 6,438,074 B1 | 8/2002 | Aki et al. | |
| 6,560,032 B2 | 5/2003 | Hatano | |
| 6,600,547 B2 | 7/2003 | Watson et al. | |
| 6,603,130 B1 | 8/2003 | Bisschops et al. | |
| 6,633,365 B2 | 10/2003 | Suenaga | |
| 6,952,253 B2 | 10/2005 | Lof et al. | |
| 6,954,256 B2 | 10/2005 | Flagello et al. | |
| 7,009,682 B2 | 3/2006 | Bleeker | |
| 7,050,146 B2 | 5/2006 | Duineveld et al. | |
| 7,075,616 B2 | 7/2006 | Derksen et al. | |
| 7,081,943 B2 | 7/2006 | Lof et al. | |
| 7,110,081 B2 | 9/2006 | Hoogendam et al. | |
| 7,193,232 B2 | 3/2007 | Lof et al. | |
| 7,193,681 B2 | 3/2007 | Hoogendam et al. | |
| 7,199,858 B2 | 4/2007 | De Smit et al. | |
| 7,295,283 B2 | 11/2007 | Cox et al. | |
| 7,326,522 B2 | 2/2008 | Dierichs | |
| 7,352,434 B2 * | 4/2008 | Streefkerk | G03F 7/709 355/30 |
| 7,355,676 B2 * | 4/2008 | Sogard | G03F 7/2041 355/53 |
| 8,456,610 B2 | 6/2013 | Hazelton et al. | |
| 2002/0020821 A1 | 2/2002 | Van Santen et al. | |
| 2002/0163629 A1 | 11/2002 | Switkes et al. | |
| 2003/0030916 A1 | 2/2003 | Suenaga | |
| 2003/0123040 A1 | 7/2003 | Almogy | |
| 2003/0174408 A1 | 9/2003 | Rostalski et al. | |
| 2004/0000627 A1 | 1/2004 | Schuster | |
| 2004/0021844 A1 | 2/2004 | Suenaga | |
| 2004/0075895 A1 | 4/2004 | Lin | |
| 2004/0109237 A1 | 6/2004 | Epple et al. | |
| 2004/0118184 A1 | 6/2004 | Violette | |
| 2004/0119954 A1 | 6/2004 | Kawashima et al. | |
| 2004/0125351 A1 | 7/2004 | Krautschik et al. | |
| 2004/0135099 A1 | 7/2004 | Simon et al. | |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0253547 A1 | 12/2004 | Endo et al. | |
| 2004/0253548 A1 | 12/2004 | Endo et al. | |
| 2004/0257544 A1 | 12/2004 | Vogel et al. | |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2004/0263809 A1 | 12/2004 | Nakano | |
| 2005/0007569 A1 | 1/2005 | Streefkerk et al. | |
| 2005/0030506 A1 | 2/2005 | Schuster | |
| 2005/0036183 A1 | 2/2005 | Yeo et al. | |
| 2005/0036184 A1 | 2/2005 | Yeo et al. | |
| 2005/0036213 A1 | 2/2005 | Mann et al. | |
| 2005/0037269 A1 | 2/2005 | Levinson | |
| 2005/0042554 A1 | 2/2005 | Dierichs et al. | |
| 2005/0046934 A1 | 3/2005 | Ho et al. | |
| 2005/0048223 A1 | 3/2005 | Pawloski et al. | |
| 2005/0068639 A1 | 3/2005 | Pierrat et al. | |
| 2005/0073670 A1 | 4/2005 | Carroll | |
| 2005/0084794 A1 | 4/2005 | Meagley et al. | |
| 2005/0100745 A1 | 5/2005 | Lin et al. | |
| 2005/0110973 A1 | 5/2005 | Streefkerk et al. | |
| 2005/0117224 A1 | 6/2005 | Shafer et al. | |
| 2005/0122497 A1 | 6/2005 | Lyons et al. | |
| 2005/0132914 A1 | 6/2005 | Mulkens et al. | |
| 2005/0134815 A1 | 6/2005 | Van Santen et al. | |
| 2005/0141098 A1 | 6/2005 | Schuster | |
| 2005/0145803 A1 | 7/2005 | Hakey et al. | |
| 2005/0146694 A1 | 7/2005 | Tokita | |
| 2005/0146695 A1 | 7/2005 | Kawakami | |
| 2005/0147920 A1 | 7/2005 | Lin et al. | |
| 2005/0153424 A1 | 7/2005 | Coon | |
| 2005/0158673 A1 | 7/2005 | Hakey et al. | |
| 2005/0164502 A1 | 7/2005 | Deng et al. | |
| 2005/0185269 A1 | 8/2005 | Epple et al. | |
| 2005/0190435 A1 | 9/2005 | Shafer et al. | |
| 2005/0190455 A1 | 9/2005 | Rostalski et al. | |
| 2005/0205108 A1 | 9/2005 | Chang et al. | |
| 2005/0213061 A1 | 9/2005 | Hakey et al. | |
| 2005/0213072 A1 | 9/2005 | Schenker et al. | |
| 2005/0217135 A1 | 10/2005 | O'Donnell et al. | |
| 2005/0217137 A1 | 10/2005 | Smith et al. | |
| 2005/0217703 A1 | 10/2005 | O'Donnell | |
| 2005/0225737 A1 | 10/2005 | Weissenrieder et al. | |
| 2005/0259233 A1 | 11/2005 | Streefkerk et al. | |
| 2005/0259234 A1 | 11/2005 | Hirukawa et al. | |
| 2005/0270505 A1 | 12/2005 | Smith | |
| 2006/0114435 A1 | 6/2006 | Hazelton et al. | |
| 2006/0114445 A1 | 6/2006 | Ebihara | |

FOREIGN PATENT DOCUMENTS

| | | |
|---|---|---|
| DE | 224448 | 7/1985 |
| DE | 242880 | 2/1987 |
| EP | 0023231 | 2/1981 |
| EP | 0418427 | 3/1991 |
| EP | 0834773 A2 | 4/1998 |
| EP | 0834773 A3 | 7/1999 |
| EP | 1039511 | 9/2000 |
| EP | 1420302 A1 | 5/2004 |
| FR | 2474708 | 7/1981 |
| JP | 57-153433 | 9/1982 |
| JP | 58-202448 | 11/1983 |
| JP | 59-19912 | 2/1984 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 05-62877 | 3/1993 |
| JP | 06-124873 | 5/1994 |
| JP | 07-132262 | 5/1995 |
| JP | 07-220990 | 8/1995 |
| JP | 8-45812 | 2/1996 |
| JP | 08-136475 | 5/1996 |
| JP | 08-171054 | 7/1996 |
| JP | 08-330224 | 12/1996 |
| JP | 08-334695 | 12/1996 |
| JP | 10-003039 | 1/1998 |
| JP | 10-020195 | 1/1998 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |

(56) References Cited

FOREIGN PATENT DOCUMENTS

| | | |
|---|---|---|
| JP | 2000-058436 | 2/2000 |
| JP | 2001-091849 | 4/2001 |
| JP | 2004-193252 | 7/2004 |
| JP | 2007-528115 | 10/2007 |
| WO | 08-316125 | 11/1996 |
| WO | 99/49504 | 9/1999 |
| WO | 02/091078 | 11/2002 |
| WO | 03/077036 | 9/2003 |
| WO | 03/077037 | 9/2003 |
| WO | 2004/019128 | 3/2004 |
| WO | 2004/053596 A2 | 6/2004 |
| WO | 2004/053950 A1 | 6/2004 |
| WO | 2004/053951 A1 | 6/2004 |
| WO | 2004/053952 A1 | 6/2004 |
| WO | 2004/053953 A1 | 6/2004 |
| WO | 2004/053954 A1 | 6/2004 |
| WO | 2004/053955 A1 | 6/2004 |
| WO | 2004/053956 A1 | 6/2004 |
| WO | 2004/053957 A1 | 6/2004 |
| WO | 2004/053958 A1 | 6/2004 |
| WO | 2004/053959 A1 | 6/2004 |
| WO | 2004/055803 A1 | 7/2004 |
| WO | 2004/057589 A1 | 7/2004 |
| WO | 2004/057590 A1 | 7/2004 |
| WO | 2004/077154 | 9/2004 |
| WO | 2004/081066 | 9/2004 |
| WO | 2004/090577 | 10/2004 |
| WO | 2004/090633 | 10/2004 |
| WO | 2004/090634 | 10/2004 |
| WO | 2004/092830 | 10/2004 |
| WO | 2004/092833 | 10/2004 |
| WO | 2004/093130 | 10/2004 |
| WO | 2004/093159 | 10/2004 |
| WO | 2004/093160 | 10/2004 |
| WO | 2004/095135 | 11/2004 |
| WO | 2005/001432 | 1/2005 |
| WO | 2005/003864 | 1/2005 |
| WO | 2005/006026 | 1/2005 |
| WO | 2005/008339 | 1/2005 |
| WO | 2005/013008 | 2/2005 |
| WO | 2005/015283 | 2/2005 |
| WO | 2005/017625 | 2/2005 |
| WO | 2005/019935 | 3/2005 |
| WO | 2005/022266 | 3/2005 |
| WO | 2005/024325 | 3/2005 |
| WO | 2005/024517 | 3/2005 |
| WO | 2005/034174 | 4/2005 |
| WO | 2005/050324 A2 | 6/2005 |
| WO | 2005/054953 | 6/2005 |
| WO | 2005/054955 | 6/2005 |
| WO | 2005/059617 | 6/2005 |
| WO | 2005/059618 | 6/2005 |
| WO | 2005/059645 | 6/2005 |
| WO | 2005/059654 | 6/2005 |
| WO | 2005/062128 | 7/2005 |
| WO | 2005/064400 | 7/2005 |
| WO | 2005/064405 | 7/2005 |
| WO | 2005/069055 | 7/2005 |
| WO | 2005/069078 | 7/2005 |
| WO | 2005/069081 | 7/2005 |
| WO | 2005/071491 | 8/2005 |
| WO | 2005/074606 | 8/2005 |
| WO | 2005/076084 | 8/2005 |
| WO | 2005/081030 | 9/2005 |
| WO | 2005/081067 | 9/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68.72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2µm Fine Patterns Using Optical Projection Lithography with an Oil Immersion Lens", Jpn. J. Appl. Phys. vol. 31 (1992), pp. 4174-4177.

Owen et al., "1/8µm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International Sematech, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, *J. Microlith., Microfab., Microsyst.* 1(1) :7-12 (2002).

European Search Report for EP Application No. 03256643.2, dated Aug. 30, 2004.

Information Disclosure Statement filed Jan. 11, 2006 for U.S. Appl. No. 11/329,269.

Office Action issued for U.S. Appl. No. 11/329,269 dated Apr. 4, 2006.

Japanese Office Action issued for Japanese Patent Application No. 2004-142059, dated Oct. 23, 2007.

Japanese Office Action mailed Jun. 18, 2013 in corresponding Japanese Patent Application No. 2012-084835.

U.S. Office Action dated Jul. 24, 2013 in corresponding U.S. Appl. No. 13/082,038.

U.S. Office Action dated Aug. 20, 2013 in corresponding U.S. Appl. No. 13/189,255.

\* cited by examiner

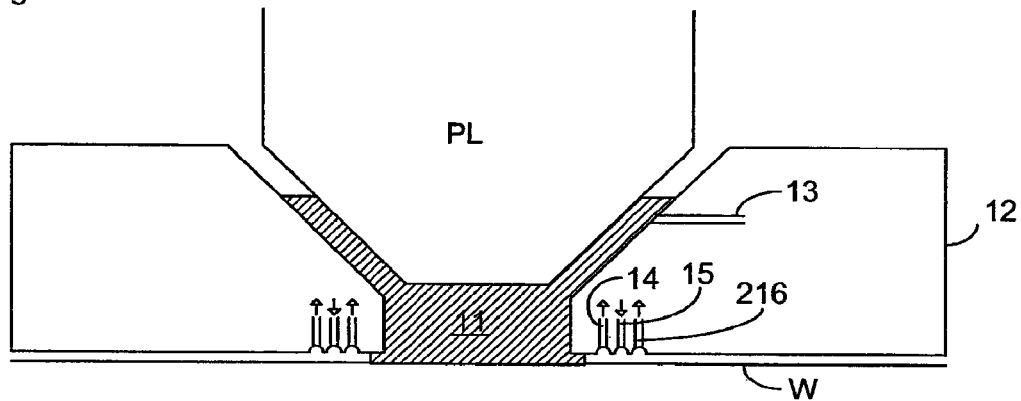
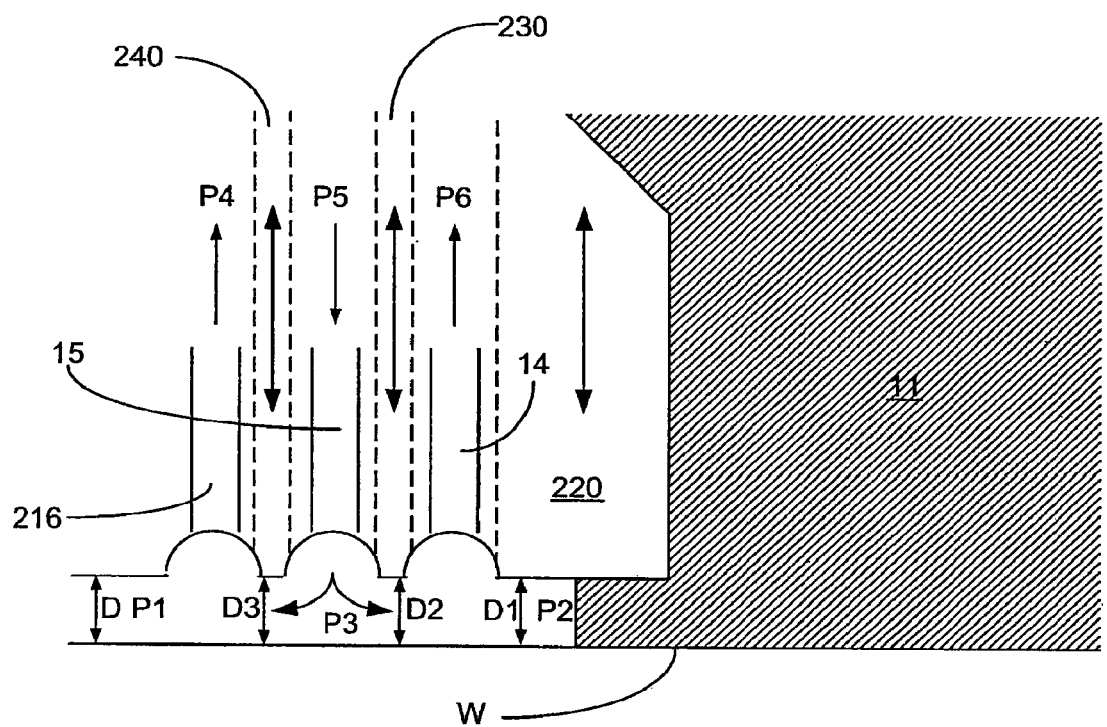

LITHOGRAPHIC APPARATUS AND DEVICE MANUFACTURING METHOD

This application is a continuation of U.S. patent application Ser. No. 13/188,026, filed Jul. 21, 2011, now U.S. Pat. No. 8,964,164, which is a continuation of U.S. patent application Ser. No. 13/082,038, filed Apr. 7, 2011, now U.S. Pat. No. 8,724,083, which is a continuation of U.S. patent application Ser. No. 12/068,546, filed Feb. 7, 2008, now U.S. Pat. No. 7,936,444, which is a continuation of U.S. patent application Ser. No. 10/844,575, filed May 13, 2004, now U.S. Pat. No. 7,352,434, which claims priority to European Patent Applications 03252955.4 and 03256643.2, filed May 13, 2003 and Oct. 22, 2003, respectively, the entire contents of each of the foregoing applications incorporated herein by reference.

BACKGROUND

1. Field

The present invention relates to a lithographic projection apparatus and a device manufacturing method.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of one, or several, dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the beam in a given direction (the "scanning"-direction) while synchronously scanning the substrate parallel or anti-parallel to this direction.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.)

However, submersing the substrate or substrate and substrate table in a bath of liquid, as disclosed for example in U.S. Pat. No. 4,509,852, incorporated herein by reference, means that there is a large body of liquid that to be accelerated during a scanning exposure. This requires additional and/or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system as the substrate generally has a larger surface area than the final element of the projection system. One way which has been proposed to arrange for this is disclosed in WO 99/49504, incorporated herein by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in the −X direction, liquid is supplied at the +X side of the element and taken up at the −X side. FIG. 2 shows the arrangement schematically in which liquid is supplied via inlet IN and is taken up on the other side of the final element of the projection system PL by outlet OUT which is connected to a low pressure source. In the illustration of FIG. 2 the liquid is supplied along the direction of movement of the substrate relative to the final element, though this does not need to be the case. Various orientations and numbers of inlets and outlets positioned around the final element are possible. One example is illustrated in FIG. 3 in which four sets of an inlet with an outlet on either side are provided in a regular pattern around the final element of the projection system PL.

Another solution which has been proposed is to provide the liquid supply system with a seal member which extends along at least a part of a boundary of the space between the final element of the projection system and the substrate table. The seal member is substantially stationary relative to the projection system in the XY plane, though there may be some relative movement in the Z direction (i.e. the direction of the optical axis). A seal is formed between the seal member and the surface of the substrate. The seal may be a contactless seal such as a gas seal.

If the substrate is immersed in liquid as proposed, some residual liquid can remain on the surface of the substrate after it has been exposed by the projection system. This liquid can cause problems in subsequent processing of the substrate.

SUMMARY

It is an aspect of the present invention to reduce the residual liquid left on the surface of a substrate after exposure by a projection system.

According to an aspect of the invention, there is provided a lithographic projection apparatus including a radiation system configured to provide a beam of radiation; a support configured to support a patterning device, the patterning devices configured to pattern the beam according to a desired pattern; a substrate table configured to hold a substrate; a projection system configured to project the patterned beam onto a target portion of the substrate and having an optical axis; and a liquid supply system configured to provide an immersion liquid on the substrate in a space between a final element of the projection system and the substrate, wherein at least part of the liquid supply system is free to at least one of move in the direction of the optical axis and rotate about at least one axis perpendicular to the optical axis.

The liquid supply system can therefore move relative to the surface of the substrate to accommodate changes in the surface height of the substrate without requiring a large clearance between the supply system and the substrate surface. The entire supply system, or only those parts likely to come into contact with the surface of the substrate, such as a sealing member, may be moved. This is particularly useful when using a liquid supply system which provides liquid to only a localized area of the substrate. Also, the liquid supply system can be moved away from the substrate, for instance during a TIS scan, in the Z direction and rotated about axes parallel to the X and Y directions.

The apparatus may further include an actuator configured to adjust the height and/or tilt of at least part of the liquid supply system relative to the substrate. This allows the height and/or tilt of the liquid supply system to be altered as needed.

The apparatus may further include a control system configured to control the actuation means to maintain a predetermined height of the liquid supply system above the substrate. This ensures that the height of the liquid supply is maintained at a desired height. The height can be chosen to minimize the residue of the liquid left on the substrate as it is scanned under the projection system.

In one embodiment, the apparatus may further include at least one sensor configured to measure a height of at least part of the liquid supply system above the surface of the substrate, and the control system uses a feedback control method with input from the at least one sensor. The feedback control method allows the height to be controlled accurately based on the actual surface height of the substrate as it is scanned under the projection system.

In another embodiment, the apparatus may further include a measurement system configured to measure a surface height of the substrate prior to the entry of the substrate into the projection system and to store the measured height in a storage device, and the control system uses feedforward control with input of the measured height from the storage device. If the surface height of the substrate is know prior to scanning of the substrate under the exposure system, this data can be used for feedforward control of the height of the liquid supply system.

In another embodiment the apparatus may further include at least one sensor configured to measure a height of the substrate in an exposure position, and the control system uses a feedforward control method with input of the height of the substrate in an exposure position. The apparatus can then measure the height of the substrate as it is exposed by the projection system. This measurement can then be used as a feedforward input for when that part of the substrate passes under the liquid supply system. Alternatively a feedback control method can be employed.

In the non-actuated state, the actuator may position the liquid supply system to its maximum setting away from the surface of the substrate in the direction of the optical axis of the projection system. This allows the control system to fail-safe. If the control signal is not supplied to the actuator (i.e. it is in a non-actuated state) the supply system is not in danger of colliding with the substrate as the supply system is positioned as far away from the substrate's surface as possible, but not so far so that immersion liquid escapes between the liquid supply system and the substrate.

The actuator may be part of the liquid supply system, the actuator including a seal extending along at least part of the boundary of the space between the final element of the projection system and the substrate table; and a gas seal configured to form a gas seal between the seal member and the surface of the substrate. The pressure in the gas seal is variable to adjust the height and/or tilt of the liquid supply system relative to the substrate. The gas seal acts to retain the liquid within the desired space and will also reduce the residue of liquid left on the substrate after it has been scanned under the projection system. The gas seal is also used to adjust the height of the liquid supply system, thereby simplifying construction as no dedicated actuator is needed.

The actuator may be connected between the liquid supply system and the base frame of the apparatus. Alternatively, the actuator may be connected between the liquid supply system and the reference frame of the apparatus. The reference frame supports, inter alia, the projection system.

The predetermined height may be in the range of 10 µm to 1000 µm. If the height is in the mentioned range the residual liquid remaining on the substrate after scanning is reduced. The height can also be varied according to the viscosity of the immersion liquid, or increased or decreased to increase/decrease the amount of liquid filling the space.

According to a further aspect of the invention there is provided a device manufacturing method including providing a substrate that is at least partially covered by a layer of radiation-sensitive material; projecting a patterned beam of radiation onto a target portion of the layer of radiation-sensitive material using a projection system; providing a liquid on the substrate to fill a space between the substrate and a final element of the projection system; and allowing a system which provides the liquid to move freely in the direction of the optical axis of the projection system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm).

The term "patterning devices" used herein should be broadly interpreted as referring to a device that can be used to impart a beam of radiation with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. In this manner, the reflected beam is patterned. In each example of a patterning device, the support may be a frame or table, for example, which may be fixed or movable as needed and which may ensure that the patterning device is at a desired position, for example with respect to the projection system. Any use of the terms "reticle" or "mask"

herein may be considered synonymous with the more general term "patterning devices" or "patterning structures."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components to direct, shape, and/or control the beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 6 depicts the liquid reservoir of another embodiment of the invention;

FIG. 7 is an enlarged view of part of the liquid reservoir of FIG. 6;

DETAILED DESCRIPTION

Figure 1:
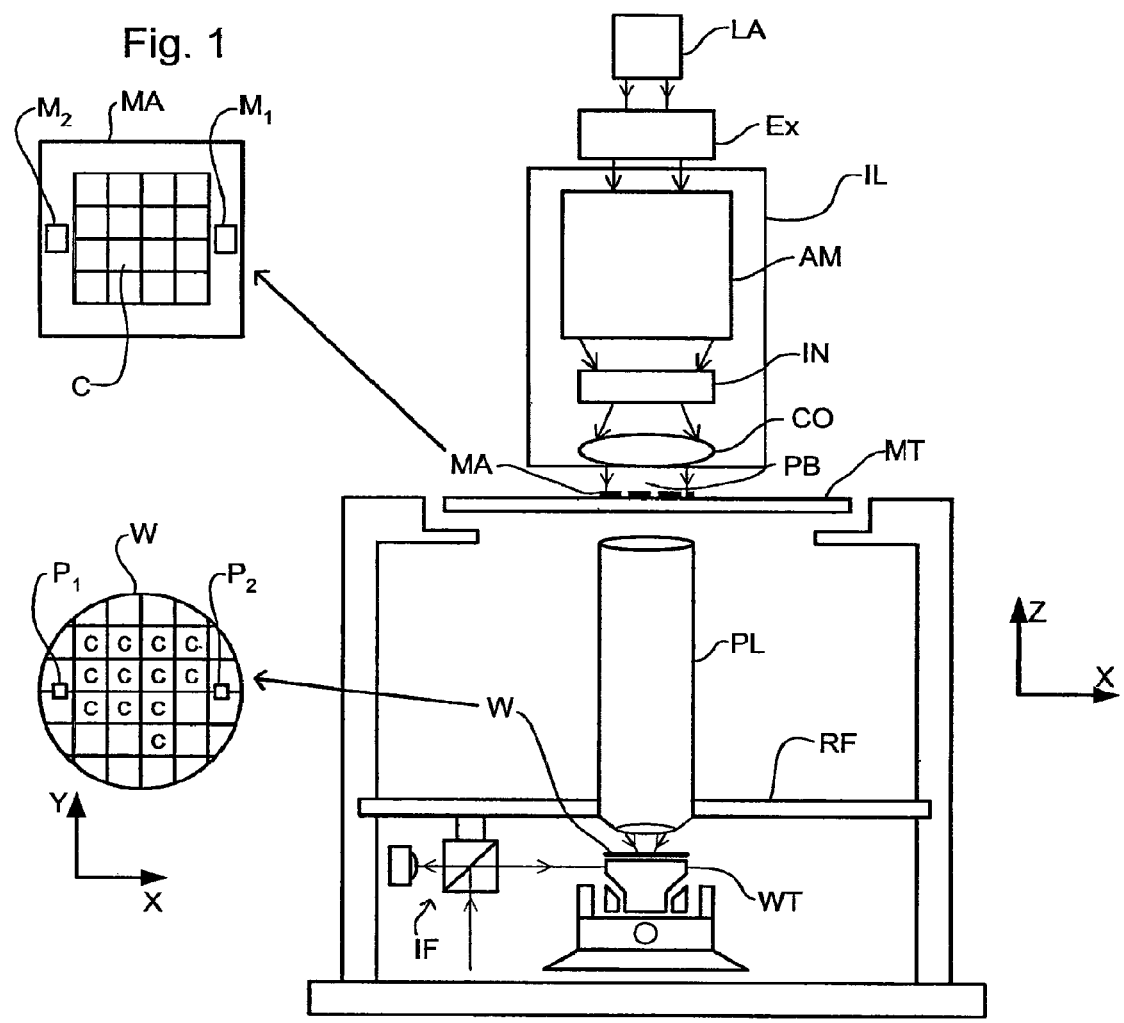
FIG. 1 depicts a lithographic projection apparatus according to an embodiment of the invention.
Figure 2:
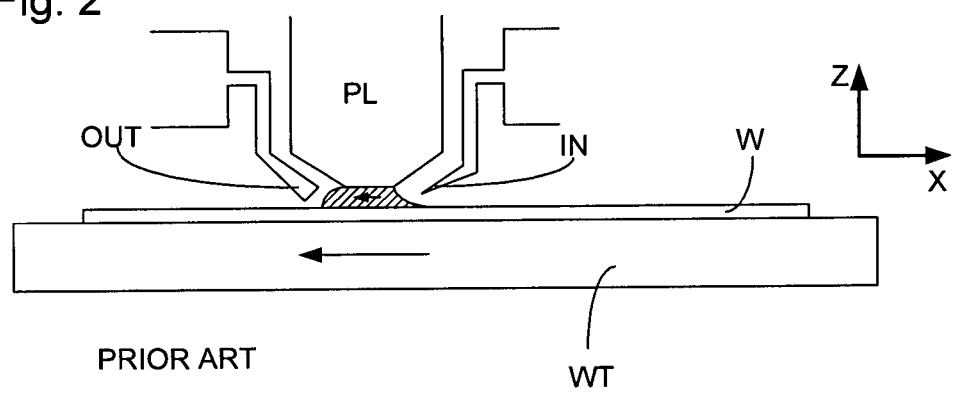
FIG. 2 depicts a side view of a liquid supply system according to the prior art.
Figure 3:
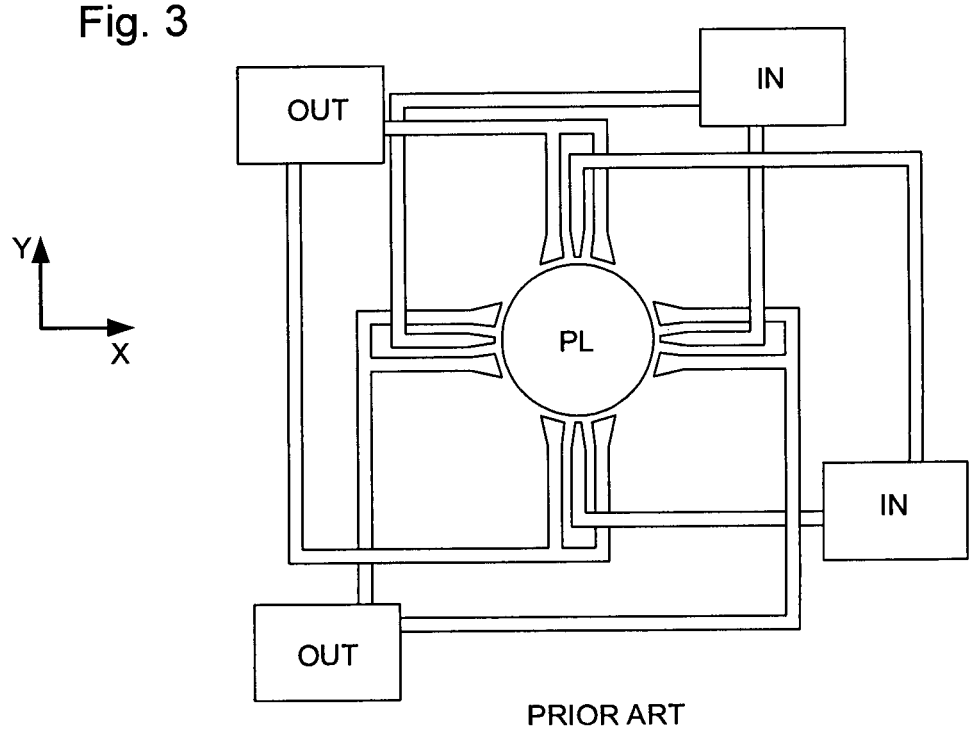
FIG. 3 depicts a plan view of the proposed liquid supply system shown in FIG. 2.

FIG. 1 schematically depicts a lithographic apparatus including an illumination system (illuminator) IL configured to provide a beam PB of radiation (e.g. UV radiation). A first support (e.g. a mask table) MT is configured to support a patterning device (e.g. a mask) MA and is connected to a first positioning device PM that accurately positions the patterning device with respect to a projection system PL. A substrate table (e.g. a wafer table) WT is configured to hold a substrate (e.g. a resist-coated wafer) W and is connected to a second positioning device PW that accurately positions the substrate with respect to the projection system PL. The projection system (e.g. a refractive projection lens) PL is configured to image a pattern imparted to the beam PB by the patterning device MA onto a target portion C (e.g. including one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives radiation from a radiation source LA. The source and the lithographic apparatus may be separate entities, for example when the source is an excimer laser. In such cases, the source is not considered to form part of the lithographic apparatus and the radiation beam is passed from the source LA to the illuminator IL with the aid of a beam delivery system including, for example, suitable directing mirrors and/or a beam expander EX. In other cases the source LA may be an integral part of the apparatus, for example when the source is a mercury lamp. The source LA and the illuminator IL, together with the beam delivery system if needed, may be referred to as a radiation system.

The illuminator IL may include an adjusting device(s) AM configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator IN and a condenser CO. The illuminator provides a conditioned beam of radiation PB having a desired uniformity and intensity distribution in its cross-section.

The beam PB is incident on a patterning device, illustrated in the form of the mask MA, which is held on the mask table MT. Having traversed the mask MA, the projection beam PB passes through the projection system PL, which focuses the beam onto a target portion C of the substrate W. With the aid of the second positioning device PW and a position sensor IF (e.g. an interferometer), the substrate table WT can be moved accurately to position different target portions C in the path of the beam PB. Similarly, the first positioning device PM and another position sensor (e.g. an interferometer, not depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper, as opposed to a scanner, the mask table MT may be connected to a short stroke actuator only, or may be fixed. The mask MA and the substrate W may be aligned using mask alignment marks M1, M2 and substrate alignment marks P1, P2.

The depicted apparatus can be used in the following modes:

1. In step mode, the mask table MT and the substrate table WT are kept essentially stationary, while an entire pattern imparted to the projection beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the beam is projected onto a target portion C. In this mode, generally a pulsed radiation source is employed and the programmable patterning device is updated as needed after each movement of the substrate table WT or in between successive radiation pulses during a scan. This mode of operation can be readily applied to maskless lithography that utilizes programmable patterning devices, such as a programmable mirror array of a type as referred to above.

Combinations and/or variations on the above described modes of use or entirely different modes of use may also be employed.

Figure 4:
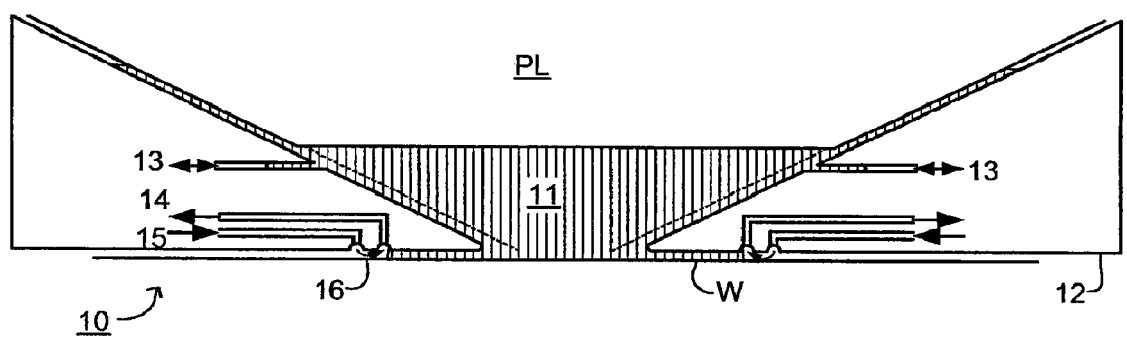
FIG. 4 depicts the liquid reservoir of an embodiment of the invention.

FIG. 4 shows a liquid reservoir 10 between the projection system PL and the substrate table WT, which is described in detail in European Patent Application No. 03252955.4. The liquid reservoir 10 is filled with a liquid 11 having a relatively high refractive index, e.g. water, provided via inlet/outlet ducts 13. The liquid has the effect that the radiation of the beam has a shorter wavelength in the liquid than in air or a vacuum, allowing smaller features to be resolved. It is well known that the resolution limit of a projection system is determined, inter alia, by the wavelength of the beam and the numerical aperture NA of the system. The presence of the liquid may also be regarded as increasing the effective numerical aperture. Furthermore, at fixed numerical aperture, the liquid is effective to increase the depth of focus.

The reservoir 10 forms a contactless seal to the substrate around the image field of the projection system so that liquid is confined to fill a space between the substrate surface and a final element of the projection system. The reservoir is formed by a seal 12 positioned below and surrounding the final element of the projection system PL. Liquid is brought into the space below the projection system and within the seal 12. The seal 12 extends a little above the final element of the projection system and the liquid level rises above the final element so that a buffer of liquid is provided. The seal 12 has an inner periphery that at the upper end closely conforms to the step of the projection system or the final element thereof and may be round, for example. At the bottom, the inner periphery closely conforms to the shape of the image field, for example rectangular, though this need not be the case.

Figure 5:
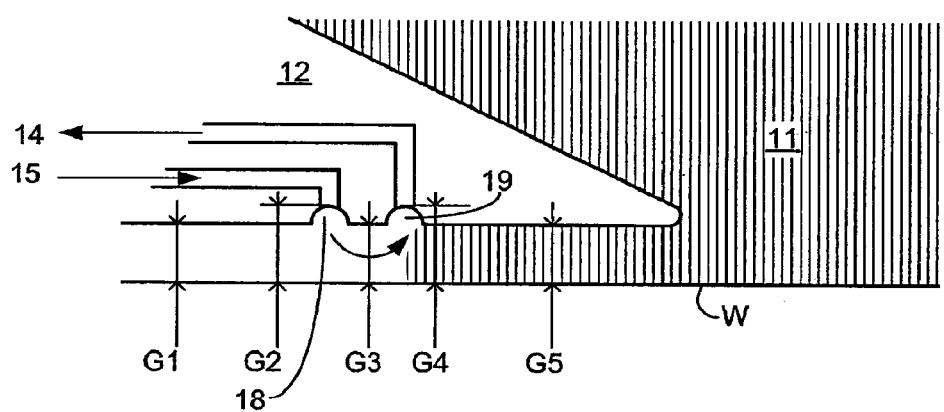
FIG. 5 is an enlarged view of part of the liquid reservoir of FIG. 4.

The liquid is confined in the reservoir by a gas seal 16 between the bottom of the seal member 12 and the surface of the substrate W. The gas seal is formed by gas, for example air or synthetic air, but may be N₂ or another inert gas, provided under pressure via an inlet 15 to the gap between the seal 12 and the substrate W and extracted via a first outlet 14. The overpressure on the gas inlet 15, vacuum level on the first outlet 14 and geometry of the gap are arranged so that there is a high-velocity gas flow inwards that confines the liquid. This is shown in more detail in FIG. 5.

The gas seal is formed by two annular grooves 18, 19 which are connected to the first inlet 15 and the first outlet 14, respectively, by a series of small conducts spaced around the grooves. A large annular hollow in the seal 12 may be provided in each of the inlet 15 and the outlet 14 to form a manifold. The gas seal 16 may also be effective to support the seal 12 by behaving as a gas bearing.

A gap G1, on the outer side of the gas inlet 15, may be small and long so as to provide resistance to air flow outwards. A gap G2, at the radius of the inlet 15, is a little larger to ensure a sufficient distribution of gas around the seal 12, the inlet 15 being formed by a number of small holes around the seal 12.

A gap G3 is chosen to control the gas flow through the seal 12. A gap G4 is larger to provide a good distribution of vacuum, the outlet 14 being formed of a number of small holes in the same manner as the inlet 15. A gap G5 is small to prevent gas/oxygen diffusion into the liquid in the space, to prevent a large volume of liquid entering and disturbing the vacuum and to ensure that capillary action will always fill it with liquid.

The gas seal 16 is thus a balance between the capillary forces pulling liquid into the gap and the airflow pushing liquid out. As the gap widens from G5 to G4, the capillary forces decrease and the airflow increases so that the liquid boundary will lie in this region and be stable even as the substrate moves under the projection system PL.

The pressure difference between the inlet 15 at G2 and the outlet 14 at G4, as well as the size and geometry of gap G3, determine the gas flow through the gas seal 16 and will be determined according to the specific embodiment. However, if the length of gap G3 is short and absolute pressure at G2 is twice that at G4, the gas velocity will be the speed of sound in the gas and cannot rise any higher. A stable gas flow will therefore be achieved.

The gas outlet system can also be used to completely remove the liquid from the system by reducing the gas inlet pressure and allowing the liquid to enter gap G4 and be sucked out by a vacuum system, which can easily be arranged to handle the liquid, as well as the gas used to form the seal. Control of the pressure in the gas seal can also be used to ensure a flow of liquid through gap G5 so that liquid in this gap that is heated by friction as the substrate moves does not disturb the temperature of the liquid in the space below the projection system.

The shape of the seal 12 around the gas inlet 15 and outlet 14 should be chosen to provide laminar flow as far as possible so as to reduce turbulence and vibration. Also, the gas flow should be arranged so that the change in flow direction at the liquid interface is as large as possible to provide maximum force confining the liquid.

The liquid supply system circulates liquid in the reservoir 10 so that fresh liquid is provided to the reservoir 10.

The gas seal 16 can produce a force large enough to support the seal 12. Indeed, it may be possible to bias the seal 12 towards the substrate to make the effective weight supported by the seal 12 higher. The seal 12 will in any case be held in the XY plane (perpendicular to the optical axis) in a substantially stationary position relative to and under the projection system but decoupled from the projection system. The seal 12 is free to move in the Z direction and can therefore move to accommodate changes in the surface height of the substrate.

When the substrate W is being moved shearing forces will try to move the penetration level of the liquid in the gap between the liquid supply system and the substrate either to the outside or to the inside (left or right as illustrated). Both are unwanted, to the outside may lead to leakage, and to the inside may lead to air bubbles in the liquid. This can also happen as the height of the liquid supply system varies. One way to keep the liquid meniscus in a constant position is to monitor and actively control the position of liquid under the liquid supply system. The control may be implemented by locally increasing and decreasing the air and vacuum pressures in the gas seal 16.

The monitoring can be done in several ways. One way is by measuring the capacitance between neighbouring metal plates mounted on the bottom of the liquid supply system or by measuring the capacitance between such a plate and the substrate or substrate table. Another way is by measuring the magnetic properties of the medium, be it air or liquid. Since both the electrical as well as magnetic signals will scale with the liquid position an accurate positional measurement is possible.

When a conducting liquid like water is used, the conducting properties of the liquid can be used by having electrical contacts which are opened or closed. A minimum of two pairs of contacts are needed, one should be open and one should be closed. Sensing of closure or opening of the contacts will lead respectively to an increase or decrease in the air pressure of the gas seal or respectively decrease and increase the underpressure of the vacuum. If a smoother control is needed the number of contacts can be increased.

Alternatively the effects of these shearing forces can be mitigated by adjusting the height and tilt of the seal member 12 as described herein. Also, it can be predicted that a height adjustment of the liquid supply system will induce movement of the meniscus and the pressure in the seal can be adjusted in a feedforward manner to account for this.

Referring to FIGS. 6 and 7, a second gas outlet 216 is provided on the opposite side of the gas inlet 15 to the first gas outlet 14. In this way any gas escaping from the gas inlet 15 outwards away from the optical axis of the apparatus is sucked up by second gas outlet 216 which is connected to a vacuum source. In this way gas is prevented from escaping from the gas seal so that it cannot interfere, for example, with interferometer readings or with a vacuum in which the projection system and/or substrate are housed.

Using the two gas outlet embodiment is also similar to the design of air bearings previously used in lithographic projection apparatus. Thus the experience gained with those air bearings can be applied directly to the gas seal of the invention. The gas seal of FIGS. 6 and 7 is particularly suitable for use as gas bearing, as well as a gas seal, such that it can be used to support the weight of the seal 12.

Sensors may be provided to either measure the distance between the bottom face of the seal 12 and the substrate W or the topography of the top surface of the substrate W. The sensors can be pneumatic, capacitive, optical (such as a level sensor or interferometer), electrical, magnetic, and/or a combination of the foregoing or any other sensor. A controller may then be used to vary the pressures applied to the gas inlet 15 and gas outlets 14, 216 to vary the pressure P2 that constrains the liquid 11 in the reservoir and the pressures P1 and P3 that support the seal 12. Thus the distance D between the seal 12 and the substrate W may be varied or kept at a constant distance. The same controller may be used to keep the seal 12 level. The controller may be controlled either by a feedforward or a feedback control loop. In a feedforward control system the measured topography of the top surface of the substrate is supplied as an input. The measurement may be taken place in a separate measurement prior to the immersion of the substrate in the projection system, or can take place when as the image is projected to the target portion of the substrate. In a feedback control system a sensor measures the distance between the seal 12 and the top surface of the substrate, this then forms the input to the control system.

Furthermore, the height of the liquid supply system above the substrate can be calculated from a knowledge of the position of the substrate table WT, the levelling map of the substrate made during the measurement and the height of the liquid supply system relative to the projection system PL, the metrology reference frame RF or the base frame BF.

FIG. 7 shows in detail how the gas seal 16 can be regulated to control independently the pressure P2 that holds the liquid 11 in the reservoir and the pressure P3 that supports the seal member 12. This control minimizes liquid losses during operation, and hence the liquid residue remaining on the substrate after scanning. The pressures P2 and P3 can also be controlled independently to account for varying conditions during exposure. Varying conditions might be different levels of liquid loss per unit time because of different scanning speeds or perhaps because the edge of a substrate W is being overlapped by the seal 12. This is achieved by varying the distance to the substrate W of discrete portions of the face of the seal 12 facing the substrate W. These portions include the portion 220 between the first gas outlet 14 and the edge of the seal 12 nearest the optical axis, the portion 230 between the gas inlet 15 and the first gas outlet 14 and the portion 240 between the second gas outlet 216 and the gas inlet 15. These portions may be moved towards and away from the substrate W by piezoelectric actuators, for example. That is the bottom face of the seal 12 may include piezoelectric actuators (e.g. stacks) which can be expanded/contracted by the application of a potential difference across them. Other mechanical devices could also be used.

The pressure P3 that is created below the gas inlet 15 is determined by the pressure P % of gas applied to the gas inlet 15, the pressures P6, P4 of gas applied to the first and second gas outlets 14, 216, respectively, and by the distance D between the substrate W and the bottom face of the seal 12 facing the substrate W. Also the horizontal distance between the gas inlet 15 and outlets 14, 216 has an effect.

The weight of the seal 12 is compensated for by the pressure P3 so that the seal 12 settles a distance D from the wafer W. A decrease in the distance D leads to an increase in the pressure P3 and an increase in the distance D will lead to a decrease in the pressure P3. Therefore this is a self regulating system.

The distance D, at a constant pushing force due to the pressure P3, can only be regulated by the pressures P4, P5 and P6. However, the combination of the pressures P5, P6 and the distance D creates the pressure P2, which is the pressure keeping the liquid 11 in the reservoir. The amount of liquid escaping from a liquid container at given levels of pressure can be calculated and the pressure in the liquid $P_{LIQ}$ is also a factor. If $P_{LIQ}$ is larger than P2, the liquid escapes from the reservoir and if $P_{LIQ}$ is less than P2, air bubbles will occur in the liquid, which is undesirable. It is desirable to try to maintain the pressure P2 at a value slightly less than $P_{LIQ}$ to ensure that no bubbles form in the liquid, and also to ensure that not too much liquid escapes as this liquid needs to be replaced. This may all be done with a constant distance D. If the distance D1 between portion 220 and the wafer W is varied, the amount of liquid escaping from the reservoir can be varied considerably as the amount of liquid escaping varies as a square of the distance D1. The variation in distance required is only of the order of 1 mm and this can easily be provided by a piezoelectric stack with an operational voltage of the order of 100V or more.

Alternatively, the amount of liquid which can escape can be regulated by placing a piezoelectric element at the bottom of the portion 230. Changing the distance D2 is effective to change the pressure P2. However, this solution might require adjustment of the pressure P5 in the gas inlet 15 in order to keep the distance D constant.

The piezoelectric elements are connected so that when no control signal is applied to them, the supply member is positioned above the substrate. This allows the chance of damage in the event of a malfunction to be reduced; when no signal is supplied the seal 12 is positioned above the substrate surface and so cannot collide with it.

The distance D3 between the lower part of the portion 240 and the substrate W can also be varied in a similar way and can be used to regulate independently the pressures P2 and P3. It should be appreciated that the pressures P4, P5 and P6 and the distances D1, D2 and D3 can all be regulated independently or in combination to achieve the desired variation of the pressures P2 and P3.

The apparatus shown in FIGS. 6 and 7 is effective for use in active management of the quantity of liquid in the reservoir 10. The standby situation of the apparatus could be, where no substrate W is being imaged, that the reservoir 10 is empty of liquid but that the gas seal is active thereby to support the seal member 12.

After the substrate W has been positioned, liquid is introduced into the reservoir 10. The substrate W is then imaged. Before the substrate W is removed the liquid from the reservoir can be removed. After exposure of the last substrate the liquid in the reservoir 10 will be removed. Whenever liquid is removed, a gas purge has to be applied to dry the area previously occupied by liquid. The liquid can be removed easily in the apparatus by variation of the pressure P2 while maintaining the pressure P3 constant as described above. In other embodiments a similar effect can be achieved by varying the pressures P5 and P6 (and the pressure P4, if necessary or applicable).

Figure 8:
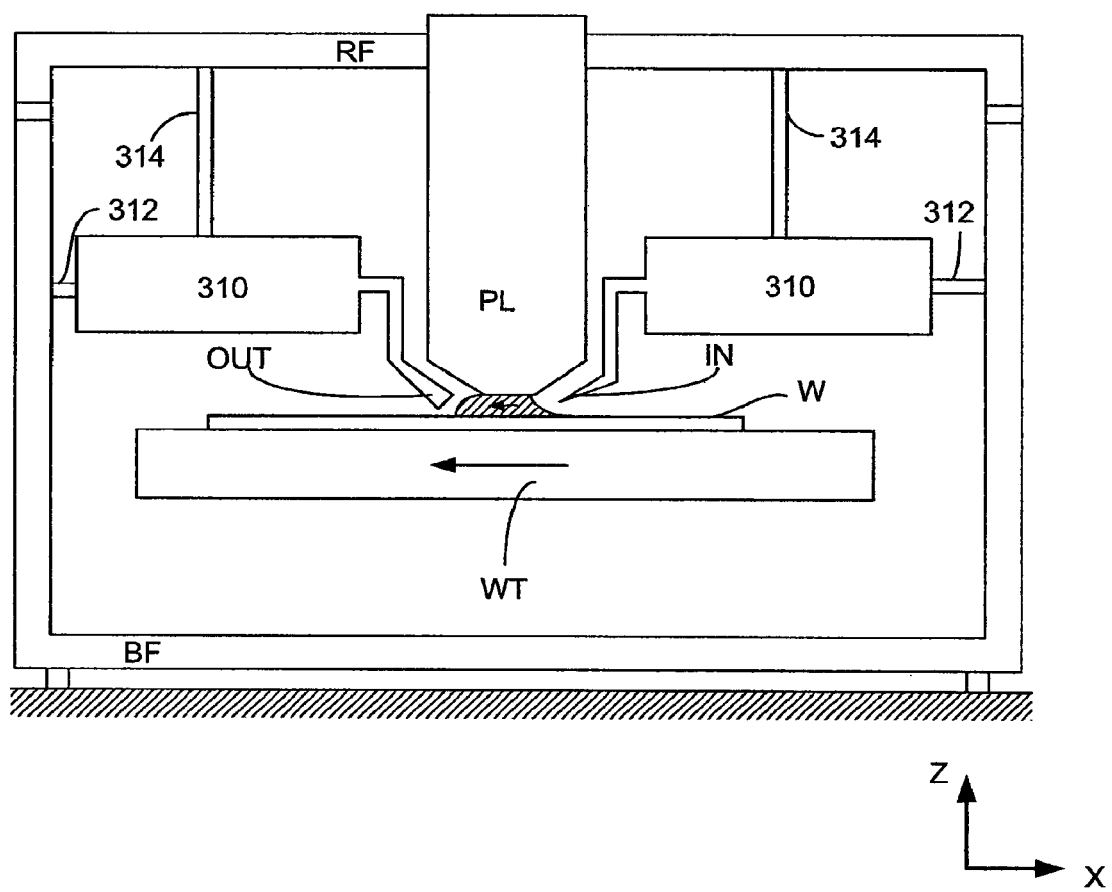
FIG. 8 depicts the liquid reservoir of another embodiment of the invention.

Referring to FIG. 8, liquid is supplied by at least one inlet IN and removed by at least one outlet OUT which make up a liquid confinement system. The liquid is supplied and taken up in the same direction as the scanning direction of the substrate. The liquid supply and take-up system 310, is positioned horizontally in the X-Y plane, parallel to the surface of the substrate, by supporting members 312 which connect the supply and take-up system 310 to a base frame BF. Supporting members 312 may be actuators so that if the projection system moves in the X-Y plane, the liquid supply system can be held substantially stationary relative to the projection system PL in the X-Y plane. A further set of actuators 314 connected between the liquid supply and take-up system 310 and a reference frame RF that also supports the projection system PL. The actuators 314 control the position of the supply and take-up system 310 in the Z direction, parallel to the optical axis of the projection system PL. However, the liquid supply system could be attached to only one of the reference RF and base BF frames, or both, and the functions of the connections to those frames could be reversed from what is described above. The actuators 314 can be piezoelectric, Lorentz motors, excenter mechanisms, linear (electrical, magnetic or a combination) or other actuators. In the situation where no signal is supplied to the actuators, the supply and take-up system 310 is positioned above the substrate to reduce the risk of collision. A signal is supplied to the actuators to move the supply and take-up system 310 closer to the surface of the substrate. The vertical movement possible is desirably of the order of several hundred microns.

In use a feedforward or feedback control system (as described above) controls the actuators 314 to maintain the liquid supply and take-up system 310 at a predetermined height above the surface of the substrate. This enables the clearance to be small if desired, enabling the liquid residue remaining on the substrate after scanning to be reduced without increasing the risk of collision.

The actuators 314 can also be connected between the supply and take-up system 310 and the projection system PL or the base frame BF. The actuators can also act in combination with the pneumatic or piezoelectric systems described above with respect to FIGS. 4-7.

The vertical positioning system shown in FIG. 8 can also be used to position the seal 12 of the liquid confinement systems described above with respect to FIGS. 4-7. In that case, it is not necessary to have the inlet 15 and the seal between the seal 12 and the substrate W can be provided by vacuum through the outlet 14 only. However, providing an air flow through the inlet 15 can be used as a safety feature to provide an air cushion between the liquid supply system and the substrate. In this case it may be useful to have sensors 20 positioned on the seal 12 in a bottom surface of the seal 12 radially outwardly of the gas seal 16. The sensors may be an air gage, or a capacitive sensor, etc. As with the apparatus of FIG. 8, it is also possible to measure the difference in the distance between the liquid supply system and the reference frame RF or the base frame BF and the substrate table WT and the same frame.

An embodiment with the seal 12 where no gas seal 16 is present between the seal 12 and the substrate W is also possible. In this case liquid is allowed to leak between the seal member 12 and the substrate W. Such a seal member is disclosed, for example, in commonly assigned, co-pending U.S. application Ser. No. 10/743,271, filed Dec. 23, 2003, incorporated herein by reference.

The present invention cannot only be used to maintain the distance between the liquid supply system and the substrate but can also be used to move the liquid supply system out of the way during substrate swap. This is possible by use of a closure disk in which a disk is placed under the projection system to act as a dummy substrate so that the liquid supply system does not need to be switched off during substrate swap. Such a system is disclosed in European Patent Application 03254059.3, incorporated herein by reference. In this way the liquid supply system may be moved away from the substrate table WT during substrate swap thereby reducing cycle time.

The following description assumes that the height of the liquid supply system above the substrate table WT is measured by comparing the distance of the liquid supply system to the metrology reference frame MT with the distance of the substrate table WT from the metrology reference frame MT. However, the same control program can be used if the height of the liquid supply system above the substrate table WT is measured directly or if the height is measured indirectly by reference to any other point or part of the apparatus.

One of the greatest hazards of an immersion lithography machine is losing control of the machine resulting in collision between the liquid supply system and the substrate or the substrate table, particularly if TIS sensors or positioning mirror blocks are on the table WT as they can be scratched by collision with the liquid supply system. In order to alleviate this hazard, it is proposed to continuously monitor the gap between the liquid supply system and the substrate table WT, as mentioned above. This position signal is differentiated to obtain a relative velocity signal.

The liquid supply system and substrate table WT geometries are arranged such that in its uppermost position the liquid supply system cannot collide with the substrate table in its uppermost position. Conversely, in the lowest position the liquid supply system can obtain, the substrate table WT can be moved to an even lower position where collision with the liquid supply system cannot occur. Furthermore, the actuators of the substrate table are arranged so that a larger acceleration of the substrate table WT downwards can be achieved than the maximum acceleration of the liquid supply system downwards. If a large acceleration of the liquid supply system towards the substrate table is detected, the substrate table WT is accelerated away from the liquid supply system to its lowest position where it is safe from the liquid supply system. Also if the substrate table WT suddenly starts accelerating towards the liquid supply system the liquid supply system is accelerated with a much larger acceleration away from the substrate table WT. The converse is also true so that the maximum acceleration of the liquid supply system is greater than the substrate table in the upwards direction but much lower than that of the substrate table in the downwards direction.

All of the sensors involved in this control are monitored and processed in hardware which is independent of the normal motion control hardware and software. If any of the signals from the sensors fails, the liquid supply system is automatically moved to its upper most position, for example, by a mechanical spring. This mechanical spring, or a magnetic force for example, also works if there is a power failure to the system.

Precautions are also taken such as only activating the liquid supply system if scanning control has started. Furthermore, another situation which may arise is that the relative velocity of the liquid supply system to the substrate table WT is too high. In this case both the liquid supply system and the substrate table WT are stopped. If the relative velocity is within acceptable limits but the distance between the liquid supply system and the substrate table WT becomes too small, the actuators are also stopped. If the relative velocity and position are both within acceptable limits, normal operation is allowed.

It may sometimes be necessary to override the safety algorithm, for example, during attaching of a closure disk as described above. The closure disk is positioned on the substrate table WT so that it is necessary to bring the liquid supply system into close proximity of the closure disk which requires overriding of the above described safety algorithm. It may only be necessary to disable the position check of the above described safety algorithm but to maintain the velocity check.

Figure 9:
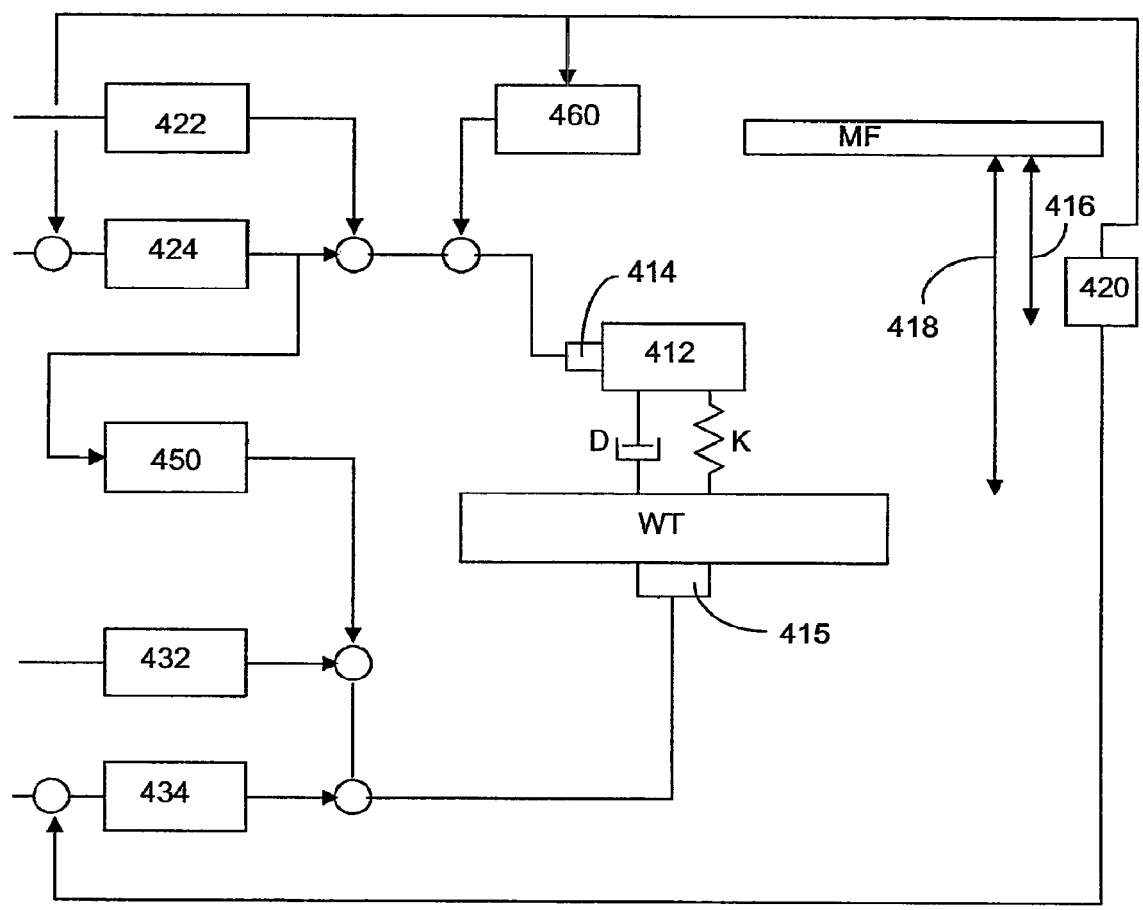
FIG. 9 depicts the control of the liquid supply system and substrate table.

FIG. 9 illustrates schematically the control loops for the present invention. A liquid supply system 412, of the seal type as described above for example, is provided with an actuator system 414 including three actuators to enable actuation in the z, Rx and Ry directions. The actuators may be, for example, Lorentz actuators with permanent magnet systems used for gravity compensation. The liquid supply system 412 is constrained by connectors to the base frame BF, reference frame RF or metrology reference frame MF in the X-Y plane.

An actuator 415 is configured to move the substrate table WT in the Z direction. The relative positions of the liquid supply system 412 and the substrate table WT are measured by measuring the relative positions of the substrate table WT to the metrology reference frame MF (i.e. measuring the distance 418) and between the liquid supply system 412 and the metrology reference frame MF (i.e. measuring the distance 416). A processor 420 processes this information and supplies it to various other controllers as described below. The information contains at least information about the relative positions of the liquid supply system 412 and the substrate table WT and may also contain other information such as the distance 418 and/or 416 as well as perhaps the time differential of any of those distances which equate to the relative velocity of the two objects and to the absolute velocity of the substrate table WT and the liquid supply system 412 respectively.

A damper D and a spring K are schematically illustrated acting between the liquid supply system 412 and substrate table WT. These are representative of the properties of the immersion liquid which transmits forces between the liquid supply system 412 and the substrate table WT. From a knowledge of the physical properties of the immersion liquid and the geometry of the liquid in the liquid supply system 412 and the geometry of the liquid supply system 412 itself, it is possible to calculate the likely damping coefficient D and spring constant K. As will be described below, knowledge of this can be used to either design the geometry of the liquid supply system 412 to increase the damping coefficient D to an extent such that the transmission of forces between the liquid supply system 412 and the substrate table WT is filtered, or to compensate for the damping coefficient D and the spring constant K when actuating the liquid supply system 412 through the actuator 414.

The standard control system for both the actuator 414 for the liquid supply system 412 and for the actuator 415 for the substrate table WT includes a positional controller which receives a signal representative of the desired position of a showerhead of the liquid supply system 412 or the substrate table. The positional controllers are labeled 424 and 434 for the liquid supply system 412 and the substrate table WT, respectively. Acceleration controllers receive signals representative of the desired acceleration of the liquid supply system 412 and/or substrate table WT. The acceleration controllers are labeled 422 and 432, respectively.

As can be seen from FIG. 9, the positional controllers 424, 423 receive a signal from the processor 420 representative of positional information regarding substrate table WT and the liquid supply system 412.

Two further elements are provided in the control system. The first of these is a filtered feedforward compensator 450 which is equal to the output of the liquid supply system positional controller 424, but may be such a signal which has been filtered to correct for the closed loop characteristics of the liquid supply system 412.

The other additional element is a compensator 460 which compensates the output of the positional controller 424 and the acceleration controller 422 for the stiffness K and damping coefficient D of the immersion liquid between the liquid supply system 412 and substrate table WT. This controller reduces the forces transmitted between the liquid supply system 412 and the substrate table WT due to removal of liquid and gas by the liquid supply system 412. Transmission of these forces can be a problem with seal type liquid supply systems 412 with a gas seal as described above with respect to FIGS. 4-7.

The present inventors have found that if the input to the actuator 414 of the liquid supply system 412 has a low band width (between 10 and 30 Hz) and the damping coefficient D is above about $1 \times 10^3$ N/(m/s), the performance of the lithography machine can be improved. This is achieved by mechanical design and therefore very cost effective. Calculations have shown that for an immersion liquid thickness of 0.1 mm the area of liquid constrained by the liquid supply system on the substrate W should be in the region of 8,000 mm$^2$.

In the above description, reference is made to the substrate table WT. This could be the fine positioning upper element of a substrate table included of an upper fine positioning element and a lower coarse positioning element or a combination of both elements, or of only the coarse element or any other suitable element of the substrate positioning mechanism of the apparatus.

In an embodiment, there is provided a lithographic projection apparatus, comprising: a substrate table configured to hold a substrate; a projection system configured to project a patterned beam of radiation onto a target portion of the substrate and having an optical axis; and a liquid supply system configured to provide an immersion liquid on the substrate in a space between the projection system and the substrate, wherein at least part of the liquid supply system is free to move in the direction of the optical axis and/or rotate about at least one axis perpendicular to the optical axis. In an embodiment, the apparatus further comprises an actuator configured to adjust at least one of the height and tilt of at least part of the liquid supply system relative to the substrate. In an embodiment, the apparatus further comprises a control system configured to control the actuator to maintain a predetermined height of at least part of the liquid supply system above the substrate. In an embodiment, the apparatus further comprises at least one sensor configured to measure a height of at least part of the liquid supply system above the surface of the substrate, wherein the control system uses a feedback control method with input from the at least one sensor. In an embodiment, the apparatus further comprises a measurement system configured to measure a surface height of the substrate prior to the entry of the substrate into the projection system and to store the measured height in a storage device, wherein the control system uses feedforward control with input of the measured height from the storage device. In an embodiment, the apparatus further comprises at least one sensor configured to measure a height of the substrate in an exposure position, wherein the control system uses a feedforward control method with input of the height of the substrate in an exposure position. In an embodiment, in a non-actuated state, the actuator positions the at least part of the liquid supply system to a maximum setting away from the surface of the substrate in the direction of the optical axis of the projection system. In an embodiment, the actuator is connected between the at least part of the liquid supply system and a base frame that supports the substrate table, or a reference frame that supports the projection system, or both the base frame and reference frame. In an embodiment, a supporting member, or a second actuator, or both the supporting member and the second actuator, is connected between the at least part of the liquid supply system and the base frame, or the reference frame, or both the base frame and the reference frame, to keep the at least part of the liquid supply system substantially stationary relative to the projection system in a plane perpendicular to the optical axis. In an embodiment, the actuator is part of the liquid supply system, the actuator comprising a seal extending along at least part of a boundary of the space between a final element of the projection system and the substrate table; and a gas seal configured to form a gas seal between the seal and the surface of the substrate, wherein the pressure in the gas seal is variable to adjust the height, or the tilt, or both the height and tilt, of the at least part of the liquid supply system with respect to the substrate table. In an embodiment, the apparatus further comprises at least one sensor configured to measure a position of an edge of the liquid relative to the gas seal and a controller configured to vary the pressure in the gas seal to influence the position of the edge of the liquid. In an embodiment, the controller is configured to operate in a feedforward manner, based on the distance between the seal and the substrate. In an embodiment, the predetermined height is approximately 10 µm to 1000 µm. In an embodiment, the apparatus further comprises a dummy disk configured to be positioned under the liquid supply system during a substrate exchange, wherein the dummy disk is attachable to the at least part of the liquid supply system, and the at least part of the liquid supply system is movable away from the substrate with the dummy disk attached during substrate swap. In an embodiment, the part of the liquid supply system is braced away from the substrate table by a non-electrical, mechanical device or a magnetic device. In an embodiment, the apparatus further comprises a safety controller configured to monitor relative positions, or velocity, or both relative positions and velocity, of the at least part of the liquid supply system and the substrate table. In an embodiment, the safety controller is configured to control movement of the at least part of the liquid supply system, or the substrate table, or both the at least part of the liquid supply system and the substrate table, in the event of a collision risk being determined from the monitoring to prevent the collision. In an embodiment, the apparatus further comprises a positional controller configured to generate control signals to position the at least part of the liquid supply system in the direction of the optical axis. In an embodiment, the positional controller is also configured to generate control signals to position the substrate table in the direction of the optical axis. In an embodiment, the apparatus further comprises a feedforward compensator configured to compensate the control signals to position the substrate table based on the control signals to position the at least part of the liquid supply system. In an embodiment, the feedforward compensator is configured to compensate for closed loop characteristics of the at least part of the liquid supply system. In an embodiment, the apparatus further comprises a damping and stiffness compensator configured to compensate the control signals to position the at least part of the liquid supply system to mitigate for the damping coefficient and stiffness of immersion liquid between the liquid supply system and the substrate. In an embodiment, at least part of the liquid supply system is free to rotate around axes orthogonal to the optical axis.

In an embodiment, there is provided a device manufacturing method, comprising: projecting a patterned beam of radiation onto a target portion of a layer of radiation-sensitive material on a substrate using a projection system; providing a liquid on the substrate to fill a space between the substrate and the projection system; and allowing at least part of a system which provides the liquid to move freely in the direction of the optical axis of the projection system and/or rotate about at least one axis perpendicular to the optical axis.

While specific embodiments of the invention have been described above, it will be appreciated that the invention may be practiced otherwise than as described. The description is not intended to limit the invention.

What is claimed is:

1. A lithographic apparatus comprising:
   a movable table;
   a projection system configured to project a patterned beam onto a target portion of a substrate;
   a liquid confinement structure configured to at least partly confine liquid to a space defined at least in part by the projection system and by the table, by the projection system and the substrate, or by the projection system and both the table and the substrate, the liquid confinement structure comprising an inlet opening configured to supply liquid to the space;

a first actuator configured to move the table with respect to and under the liquid confinement structure; and a second actuator configured to move at least part of the liquid confinement structure with respect to the table.

2. The lithographic apparatus of claim 1, wherein the inlet opening opens to the space at a location below a bottom surface of the projection system and above the table.

3. The lithographic apparatus of claim 1, wherein the at least part of the liquid confinement structure is located below the projection system and above the table, and the at least part of the liquid confinement structure has an aperture to allow the patterned beam to pass through and allow fluid communication between the substrate and the projection system.

4. The lithographic apparatus of claim 1, wherein the liquid confinement structure extends along at least part of a boundary of the space, the liquid confinement structure having a substantially planar bottom surface.

5. The lithographic apparatus of claim 4, further comprising a control system configured to cause the second actuator to move the at least part of the liquid confinement structure to provide, or maintain, a certain height of the bottom surface of the liquid confinement structure with respect to the substrate, the table, or both the substrate and the table.

6. The lithographic apparatus of claim 1, wherein the at least part of the liquid confinement structure comprises an outlet to remove fluid from the space, the outlet located on a bottom surface of the liquid confinement structure.

7. The lithographic apparatus of claim 1, wherein the second actuator is an electrically-driven actuator.

8. The lithographic apparatus of claim 1, wherein the liquid confinement member extends around an outer periphery of the space, the outer periphery of the space is smaller in plan than the substrate.

9. A device manufacturing method comprising:

supplying liquid via an inlet opening of a liquid confinement structure of a lithographic apparatus to a space defined at least in part by a projection system of the lithographic apparatus and by a movable table of the lithographic apparatus, by the projection system and a substrate, or by the projection system and both the table and the substrate;

at least partly confining the liquid in the space using the liquid confinement structure;

projecting a patterned beam of radiation, through the liquid, onto a target portion of the substrate, the patterned beam projected using the projection system;

displacing, using a first actuator, the table with respect to and under the liquid confinement structure; and moving, using a second actuator, at least part of the liquid confinement structure with respect to the table.

10. The method of claim 9, wherein the inlet opening opens to the space at a location below a bottom surface of the projection system and above the table.

11. The method of claim 9, wherein the at least part of the liquid confinement structure is located below the projection system and above the table, and the at least part of the liquid confinement structure has an aperture to allow the patterned beam to pass through and allow fluid communication between the substrate and the projection system.

12. The method of claim 9, wherein the liquid confinement structure has a substantially planar bottom surface and further comprising causing, using a control system, the second actuator to move the at least part of the liquid confinement structure to provide, or maintain, a certain height of the bottom surface of the liquid confinement structure with respect to the substrate, table, or both.

13. The method of claim 9, further comprising removing fluid from the space using an outlet of the at least part of the liquid confinement structure, the outlet located on a bottom surface of the liquid confinement structure.

14. A lithographic apparatus comprising:

a movable table;

a projection system configured to project a patterned beam onto a target portion of a substrate;

a liquid confinement structure configured to at least partly confine liquid to a space defined at least in part by the projection system and by the table, by the projection system and the substrate, or by the projection system and both the table and the substrate, at least part of the liquid confinement structure being underneath a bottom surface of the projection system, the bottom surface of the projection system arranged to contact the liquid;

a first actuator configured to move the table with respect to and under the liquid confinement structure; and a second actuator configured to move the at least part of the liquid confinement structure with respect to the table.

15. The lithographic apparatus of claim 14, wherein the at least part of the liquid confinement structure has a generally planar surface defining an aperture to allow the patterned beam to pass through and allow fluid communication between the substrate and the projection system.

16. The lithographic apparatus of claim 14, wherein at least part of the liquid confinement structure has a generally planar bottom surface and further comprising a control system configured to cause the second actuator to move the at least part of the liquid confinement structure to provide, or maintain, a certain height of the bottom surface of the liquid confinement structure with respect to the substrate, the table, or both the substrate and the table.

17. The lithographic apparatus of claim 14, wherein the at least part of the liquid confinement structure comprises an outlet to remove fluid from the space, the outlet located on a bottom surface of the liquid confinement structure.

18. The lithographic apparatus of claim 14, wherein the liquid confinement structure further comprises an inlet opening configured to supply liquid to the space, wherein the inlet opening opens to the space at a location below the projection system and above the table.

19. The lithographic apparatus of claim 18, wherein the inlet opening is configured to provide a flow of the liquid from the inlet opening in a direction substantially parallel to a top surface of the table.

20. The lithographic apparatus of claim 14, wherein the second actuator is an electrically-driven actuator.

* * * * *

UNITED STATES PATENT AND TRADEMARK OFFICE
CERTIFICATE OF CORRECTION

PATENT NO. : 9,477,160 B2  
APPLICATION NO. : 14/624167  
DATED : October 25, 2016  
INVENTOR(S) : Bob Streefkerk et al.

It is certified that error appears in the above-identified patent and that said Letters Patent is hereby corrected as shown below:

On the Title Page

On Page 3, Item (56) References Cited - Foreign Patent Documents, Column 1, Line 7  
replace "WO    08-316125    11/1996"  
with --JP    08-316125    11/1996--.

On Page 3, Item (56) References Cited - Foreign Patent Documents, Column 1, Line 28  
replace "WO    2004/081066    9/2004"  
with --WO    2004/081666    9/2004--.

Signed and Sealed this  
Seventh Day of February, 2017

Michelle K. Lee  
*Director of the United States Patent and Trademark Office*